United States Patent
Shin

(10) Patent No.: US 11,532,741 B2
(45) Date of Patent: Dec. 20, 2022

(54) SEMICONDUCTOR DEVICE HAVING VERTICAL DMOS AND MANUFACTURING METHOD THEREOF

(71) Applicant: KEY FOUNDRY CO., LTD., Cheongju-si (KR)

(72) Inventor: Hyun Kwang Shin, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 170 days.

(21) Appl. No.: 17/150,114

(22) Filed: Jan. 15, 2021

(65) Prior Publication Data

US 2022/0059689 A1    Feb. 24, 2022

(30) Foreign Application Priority Data

Aug. 20, 2020    (KR) .................. 10-2020-0104613

(51) Int. Cl.
| | | |
|---|---|---|
| *H01L 29/78* | (2006.01) | |
| *H01L 29/66* | (2006.01) | |
| *H01L 27/092* | (2006.01) | |
| *H01L 29/423* | (2006.01) | |

(52) U.S. Cl.
CPC ........ *H01L 29/7813* (2013.01); *H01L 27/092* (2013.01); *H01L 29/4236* (2013.01); *H01L 29/66734* (2013.01)

(58) Field of Classification Search
CPC ............. H01L 29/7813; H01L 29/4236; H01L 29/66734; H01L 27/092
USPC ........................................................ 257/330
See application file for complete search history.

(56) References Cited

U.S. PATENT DOCUMENTS

| | | | |
|---|---|---|---|
| 6,773,995 B2 | 8/2004 | Shin et al. | |
| 2004/0016961 A1 | 1/2004 | Shin et al. | |
| 2005/0062075 A1 | 3/2005 | Hshieh et al. | |
| 2006/0030142 A1 | 2/2006 | Grebs et al. | |
| 2008/0265314 A1* | 10/2008 | Kobayashi | H01L 24/06 257/E29.136 |
| 2009/0014790 A1* | 1/2009 | Otake | H01L 29/0615 257/E29.256 |
| 2012/0161201 A1* | 6/2012 | Hsieh | H01L 29/0619 257/140 |
| 2012/0313141 A1* | 12/2012 | Hsieh | H01L 29/7393 257/E27.06 |

(Continued)

FOREIGN PATENT DOCUMENTS

| | | | |
|---|---|---|---|
| JP | 2009-43795 A | | 2/2009 |
| JP | 2009043795 A | * | 2/2009 |

(Continued)

OTHER PUBLICATIONS

Korean Office Action dated Oct. 20, 2021 in counterpart Korean Patent Application No. 10-2020-0104613 (6 pages in Korean).

*Primary Examiner* — Igwe U Anya
(74) *Attorney, Agent, or Firm* — NSIP Law

(57) ABSTRACT

A semiconductor device includes a substrate, a buried doped layer formed on the substrate, a trench gate formed on the buried doped layer, a source region formed adjacent the trench gate, an interlayer dielectric layer formed on the trench gate and the source region, a source contact plug formed to extend and connect to the source region, and a drain contact plug, extending and connecting to the buried doped layer, formed deeper than the source contact plug.

28 Claims, 18 Drawing Sheets

(56) References Cited

U.S. PATENT DOCUMENTS

2019/0237576 A1    8/2019    Qiao et al.

FOREIGN PATENT DOCUMENTS

| KR | 10-2004-0009680 A | 1/2004 |
| KR | 10-2010-0136028 A | 12/2010 |

* cited by examiner

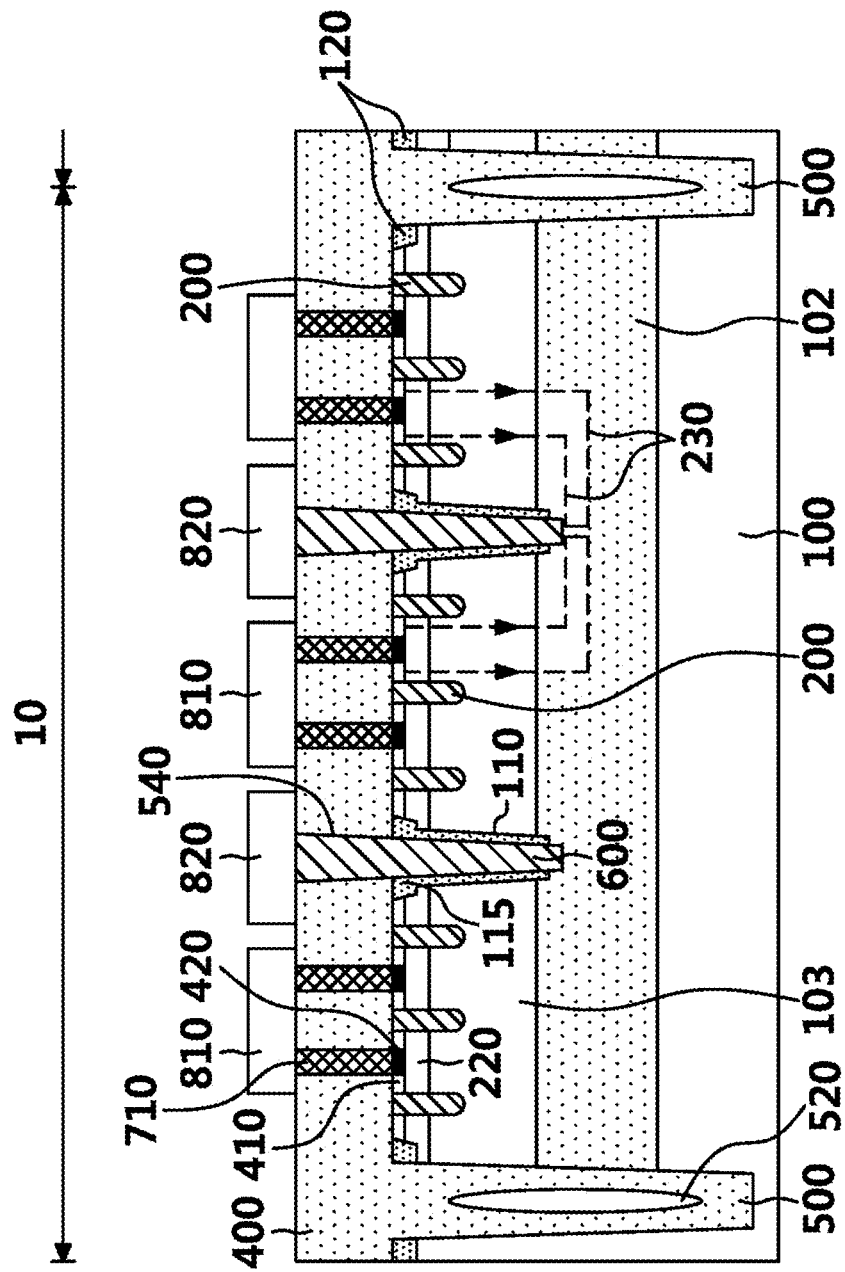

SEMICONDUCTOR DEVICE HAVING VERTICAL DMOS AND MANUFACTURING METHOD THEREOF

CROSS-REFERENCE TO RELATED APPLICATIONS

This application claims the benefit under 35 USC 119(a) of Korean Patent Application No. 10-2020-0104613 filed on Aug. 20, 2020 in the Korean Intellectual Property Office, the entire disclosure of which is incorporated herein by reference for all purposes.

BACKGROUND

1. Field

The following description relates to a semiconductor device having a vertical DMOS structure.

2. Description of Related Art

The process of manufacturing several semiconductor devices on a single semiconductor substrate at once may require a considerable cost. This cost may be incurred because dozens of masks may be used for manufacturing each device, and dozens of lithography and etching processes may also be involved. A key to producing cheaper semiconductor devices or chips may be to reduce the number of these processes. Bipolar-CMOS-DMOS (BCD) technology corresponds to this, among the processes of manufacturing several semiconductor devices on a single semiconductor substrate at once.

In recent years, with the development of BCD technology, a Double-Diffused Metal-Oxide-Semiconductor (DMOS) transistor and a Complementary Metal-Oxide-Semiconductor (CMOS) transistor, which are high voltage power MOS transistor devices, may be configured together on a single IC chip. When a DMOS transistor and a CMOS transistor are combined and integrated into a single IC chip, it may be possible to provide design diversity, improved performance, and reliability, and also may be possible to reduce overall system manufacturing costs.

Typically, in semiconductor devices using BCD technology, DMOS devices may still be manufactured using a lateral type structure. However, when the DMOS device is manufactured in a lateral type, there may be a problem in that the degree of integration may be disadvantageous due to lateral diffusion of the semiconductor device. Also, there may be a limit in increasing the channel density because current may flow in the horizontal direction.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a substrate, a buried doped layer formed on the substrate, a trench gate formed on the buried doped layer, a source region formed adjacent the trench gate, an interlayer dielectric layer formed on the trench gate and the source region, a source contact plug formed to extend and connect to the source region, and a drain contact plug, extending and connecting to the buried doped layer, formed deeper than the source contact plug.

The drain contact plug may be deeper than a bottom surface of the trench gate.

The drain contact plug may be formed to extend from the interlayer dielectric layer to the buried doped layer.

A width of the drain contact plug may be greater than a width of the trench gate.

A width of the drain contact plug may be greater than a width of the source contact plug.

The device further may further include a drift region formed on the buried doped layer, a body region formed in the drift region, a body contact region formed in the body region, a source metal wiring connected to the source contact plug, and a drain metal wiring connected to the drain contact plug. The drain contact plug may be formed to extend through the body region and the drift region, and extend to the buried doped layer.

The drain contact plug may be formed in a drain contact hole.

The device may further include a middle trench filled with a gap-fill dielectric material to surround the drain contact plug, and directly contact the buried doped layer.

The device may further include a shallow trench having a depth shallower than a depth of the middle trench, and a deep trench having a depth deeper than the depth of the middle trench. The shallow trench may be filled with a gap-fill dielectric material, and the deep trench may be filled with the interlayer dielectric layer.

The deep trench may be formed deeper than the buried doped layer, and an air gap may be formed in the deep trench.

The buried doped layer may be used as a drain region. The semiconductor device may be a vertical DMOS device, and a movement path of electrons may be formed in a vertical direction to the surface of the substrate.

The trench gate may surround the drain contact plug.

The source contact plug may include a plurality of source contact plugs, and in a plan view, the plurality of source contact plugs may surround the drain contact plug, and the drain contact plug may be located at the center of the plurality of source contact plugs.

The device may further include a Complementary Metal-Oxide-Semiconductor (CMOS) device, an extended drain MOS (EDMOS) device, and a bipolar junction transistor (BJT) device on the substrate.

In another general aspect, a method of manufacturing a semiconductor device includes forming a trench gate formed in a substrate, forming a source region adjacent the trench gate, forming an interlayer dielectric layer on the trench gate and the source region, forming a drain contact plug by etching the interlayer dielectric layer and the substrate, forming a source contact plug connected to the source region by etching the interlayer dielectric layer, wherein the drain contact plug is formed deeper than the source contact plug.

The method may further include forming a middle trench in the substrate, and forming a gap-fill dielectric material in the middle trench. The drain contact plug may be formed in the gap-fill dielectric material.

The forming of the drain contact plug may include forming a drain contact mask pattern on the interlayer dielectric layer, etching the interlayer dielectric layer by using the drain contact mask pattern, forming a drain contact hole by etching a gap-fill dielectric material in the middle trench, and filling the drain contact hole with a metal material.

The method may further include forming a buried doped layer on the substrate. The drain contact plug may be formed to extend from the interlayer dielectric layer to the buried doped layer.

The method may further include forming a drift region on the buried doped layer, forming a body region in the drift region, forming a body contact region in the body region, and forming a source metal wiring connected to the source contact plug and a drain metal wiring connected to the drain contact plug.

The method may further include forming a shallow trench in the substrate, and forming a deep trench in the substrate. A depth of a bottom surface of the drain contact plug may be located between a bottom surface of the shallow trench and a bottom surface of the deep trench.

The deep trench may be filled with the interlayer dielectric layer, and an air gap may be formed in the deep trench.

The method may further include forming a Complementary Metal-Oxide-Semiconductor (CMOS) device, an extended drain MOS (EDMOS) device, and a bipolar junction transistor (BJT) device on the substrate.

The drain contact plug may extend through the body region and the drift region and extend to the buried doped layer.

In another general aspect, a semiconductor device includes a buried doped layer formed on a substrate, a drift region and a trench gate formed on the buried doped layer, a body region formed in the drift region, and a drain contact plug formed to extend through the body region and the drift region and extend to the buried doped layer.

The device may further include a source region and a body contact region formed in the body region, an interlayer dielectric layer formed on the trench gate, a source contact plug connected to the source region. A length of the drain contact plug may be formed to be longer than a length of the source contact plug.

The device may further include a source metal wiring formed on the interlayer dielectric layer and connected to the source contact plug, and a drain metal wiring formed on the interlayer dielectric layer and connected to the drain contact plug.

The drain contact plug may be formed starting from the interlayer dielectric layer and extended to the buried doped layer.

In another general aspect, a semiconductor device includes a buried doped layer formed between a substrate and an interlayer dielectric layer, source contact plugs each formed to extend and connect to a source region, a drain contact plug formed, deeper than the source contact plugs, between adjacent ones to the source contact plugs to extend and connect to the buried doped layer, and trench gates each opposingly formed about the drain contact plug. One of the trench gates is formed between the drain contact plug and one of the source contact plugs and another of the trench gates is formed between the drain contact plug and another of the source contact plugs.

The device may further include an interlayer dielectric layer formed on the trench gates and the source region. The source region may be formed adjacent the one of the trench gates.

The device may further include a drift region formed on the buried doped layer, a body region formed in the drift region, and a body contact region formed in the body region. The drain contact plug may be formed to extend to the buried doped layer through the body region and the drift region.

Other features and aspects will be apparent from the following detailed description, the drawings, and the claims.

BRIEF DESCRIPTION OF THE DRAWINGS

FIG. 1A is a cross-sectional view of a vertical DMOS semiconductor device, according to one or more examples.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1B:
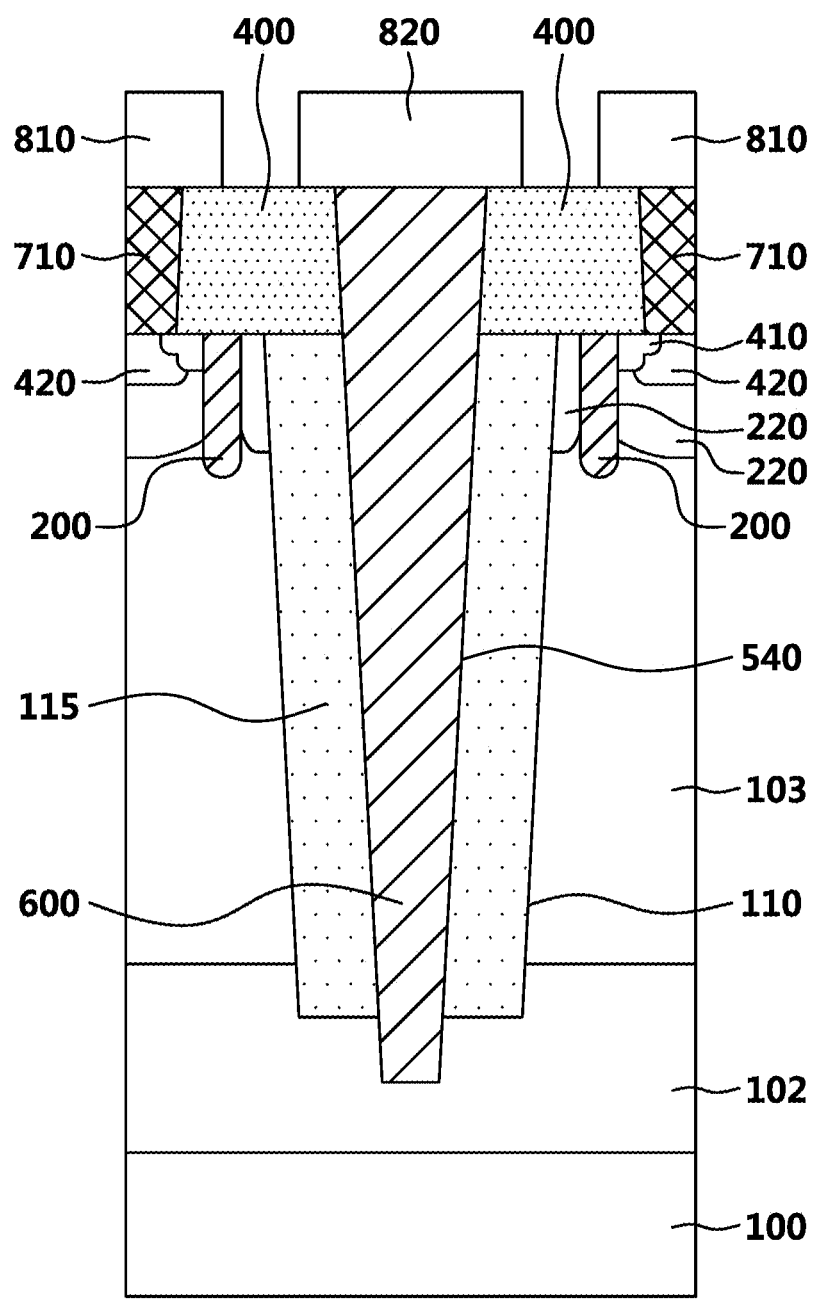
FIG. 1B is an enlarged view of a drain contact plug and its periphery of a vertical DMOS semiconductor device, according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Terms such as "including" or "comprising" used in the embodiments should not be construed as necessarily including all of various components, or various operations described in the specification, and it should be construed that some of the components or some of the operations may not be included or may further include additional components or operations.

The use of the term "may" herein with respect to an example or embodiment (e.g., as to what an example or embodiment may include or implement) means that at least one example or embodiment exists where such a feature is included or implemented, while all examples are not limited thereto.

Objects and effects, and technical configurations for achieving them of the present disclosure are apparent with reference to the examples described below in detail with the accompanying drawings. In describing the present disclosure, when it is judged that a detailed description of a known function or configuration may unnecessarily obscure the subject matter of the present disclosure, the detailed description thereof is omitted.

The following terms are defined in consideration of functions in the present disclosure, which may vary depending on the user, intention, or custom of the operator.

However, the present disclosure is not limited to the examples disclosed below, but may be implemented in various forms. The present examples are merely provided to complete the disclosure of the present disclosure and to fully inform those skilled in the art the scope of the present disclosure, and the present disclosure is defined by the scope of the claims. Therefore, the definition should be made with respect to the contents throughout the specification.

The present disclosure discusses a semiconductor device in which a vertical DMOS structure and a DMOS drain contact plug structure are formed. The present disclosure also discusses a manufacturing method of such a semiconductor device.

A purpose of the present disclosure is to provide a semiconductor device having a DMOS device of which occupying area in the semiconductor device is reduced compared to a semiconductor device of an alternative art.

Another purpose of the present disclosure is to provide a semiconductor device capable of maximizing a channel density.

And although the manufacturing process of the semiconductor device is changed for these purposes, as the other processes except for some processes of the present disclosure can be applied to the known BCD process as it is, so that the above-described purposes can be achieved with minimal process improvement.

Hereinafter, the present disclosure is described in more detail based on the examples illustrated in the drawings.

FIG. 1A is a cross-sectional view of a vertical DMOS semiconductor device according to one or more examples of the present disclosure.

The vertical DMOS device 10 comprises a substrate 100, an N-type buried doped layer 102 formed on the substrate 100, a drift region 103 formed on the buried doped layer 102, and a body region 220 formed in the drift region 103. The vertical DMOS device 10 further comprises a plurality of vertical trench gates 200 formed from a top surface of the substrate into the drift region through the body region 220, wherein a trench gate electrode is formed in each of the trench gates. The vertical DMOS device 10 further comprises a source region 410 and a body contact region 420 formed in the body region 220, wherein the source region 410 and the body contact region 420 disposed between the trench gates.

The vertical DMOS device 10 further comprises a shallow trench 120 formed on the substrate surface, a middle trench 110 formed extending from the substrate surface to the buried doped layer 102 and overlapped with the shallow trench 120. The middle trench 110 and the shallow trench 120 are filled with a gap-fill dielectric material 115. The vertical DMOS device 10 further comprises a deep trench 500 having a depth deeper than the depths of the shallow trench 120 and the middle trench 110. The deep trench 500 extends through the buried doped layer 102 and also overlaps with the shallow trench 120. The deep trench 500 has a depth deeper than the depth of the buried doped layer 102.

The vertical DMOS device 10 further comprises an interlayer dielectric layer 400 formed on the substrate 100. The interlayer dielectric layer 400 may be filled into the deep trench 500. An air-gap 520 may be formed in the deep trench 500. A drain contact hole 540 is formed in the interlayer dielectric layer 400 and further penetrates into a portion of the substrate, such that a bottom surface of the drain contact hole 540 contacts the buried doped layer 102. The drain contact hole 540 is formed within the middle trench 110, and its depth is deeper than the depth of the middle trench 110. A drain contact plug 600, formed in the drain contact hole 540, contacts the buried doped layer 102 to form a current path. The drain contact plug 600A also contacts the gap-fill dielectric material 115 disposed in the middle trench 110. The use of the term 'may' herein with respect to an example or embodiment, e.g., as to what an example or embodiment may include, implement, or achieve means that at least one example or embodiment exists with such a feature, implementation, or achievement, while also noting that all examples and embodiments are not limited thereto and alternate examples or embodiments may also exist.

A source contact plug 710 is formed spaced apart from drain contact plug 600 and simultaneously connected to the source region 410 and the body contact region 420. The vertical DMOS device 10 further includes a source metal wiring 810 connected to the source contact plug 710, and a drain metal wiring 820 connected to the drain contact plug 600. Both the source metal wiring 810 and the drain metal wiring 820 are formed on the interlayer dielectric layer 400.

In this example, the buried doped layer 102 is used as a drain region, and a movement path of electrons 230 is formed in a direction vertical to the substrate surface. The N-type drift region 103 is used for the movement path of electrons. That is, the buried doped layer 102 is used as a drain region, and serves as a passage for a drain current. Electrons generated in the N-type source region 410 pass through the P-type body region 220 and pass through the N-type drift region 103. And it arrives at the N-type buried doped layer 102. Because the N-type buried doped layer 102 is a region doped with a high-concentration N-type dopant, its resistance is very low. Therefore, the electrons may flow into the drain contact plug 600. That is, electrons flow through the source metal wiring 810, the source contact plug 710, the body contact region 420, the N-type source region 410, the P-type body region 220, the N-type drift region 103, the buried doped layer 102, and finally the drain contact plug 600.

By using the vertical type DMOS device 10 of the semiconductor device of the present disclosure, the chip area can be drastically reduced compared to the lateral type DMOS device. It is possible to secure a variety of chip device designs. It is also possible to improve channel density.

In this example, the middle trench 110 is formed surrounding the drain contact plug 600. Therefore, the width of the middle trench 110 is larger than the width of the drain contact plug 600. In addition, the depth of the middle trench 110 is deeper than the bottom of the trench gate 200. The middle trench 110 may also be in direct contact with the buried doped layer 102. The middle trench 110 is deeper than the shallow trench 120 and has a depth shallower than the deep trench 500. That is, the middle trench 110 has a depth between the shallow trench 120 and the deep trench 500.

The shallow trench 120 may be filled with the gap-fill dielectric material 115, and the deep trench 500 may be filled with the interlayer dielectric layer 400. The deep trench 500 may be formed deeper than the buried doped layer 102, and the air-gap 520 may be formed in the deep trench 500.

The drain contact plug 600 may be deeper than the bottom surface of the trench gate 200. In addition, the width of the drain contact plug 600 may be larger than the width of the source contact plug 710. In addition, the width of the drain contact plug 600 may be larger than the width of the trench gate 200.

FIG. 1B is an enlarged view of a drain contact plug of a vertical DMOS semiconductor device and its periphery according to one or more examples of the present disclosure.

In the vertical DMOS semiconductor device 10, an N-type buried doped layer 102 used as a drain region is formed on a substrate 100. Then, an N-type drift region 103 is formed on the N-type buried doped layer 102. In addition, a middle trench 110 formed in the semiconductor substrate 100 is formed, and the middle trench 110 is internally filled with a gap-fill dielectric material 115. In addition, a drain contact hole 540 is formed in the middle trench 110. In addition, a metal wiring is formed inside the drain contact hole 540 to form a drain contact plug 600. The middle trench 110, the gap-fill dielectric material 115, the drain contact hole 540, and the drain contact plug 600 are in direct contact with the N-type buried doped layer 102. In this example, the drain contact hole 540 and the drain contact plug 600 may be formed deeper than the trench 110 into the N-type buried doped layer 102. The depth of the drain contact hole 540 and the drain contact plug 600 may be greater than the depth of the middle trench 110 or the gap-fill dielectric material 115. The difference in depth is due to an etching process for forming the drain contact hole 540 and the drain contact plug 600 (see FIG. 14B). The drain contact plug 600 may be formed by filling the drain contact hole 540 with a conductive material, such as tungsten or copper. Metallic materials such as tungsten (W), Al, and Cu may be used as the conductive material. Alternatively, a doped polysilicon material may be used. In one or more examples of the present disclosure, the drain contact plug 600 is formed by filling tungsten (W).

In addition, the drain contact plug 600 is formed to extend through the body region 220 and the drift region 103 and extend into the buried doped layer 102. The outer surface of the drain contact hole 540 or the drain contact plug 600 is surrounded by the gap-fill dielectric material 115 and the interlayer dielectric layer 400. That is, it is surrounded by the gap-fill dielectric material 115 in the substrate, and is surrounded by the interlayer dielectric layer 400 above the substrate 100. And the width may be narrowed in a downward direction to form a cone. In addition, the DMOS drain contact plug 600 has a vertical length that is the sum of the depth of the middle trench 110 and the thickness of the interlayer dielectric layer 400. In a non-limiting example, the middle trench 110 is formed in a range of 1 to 10 μm in the substrate 100, a value obtained by adding the thickness of the interlayer dielectric layer 400 to the 1 to 10 μm may be a total vertical length of the DMOS drain contact plug 600 of 2 to 15 μm.

A trench gate 200 is formed around the drain contact plug 600. In this example, the trench gate also may refer to the trench gate electrode 200 formed in the trench. Before forming the trench gate electrode 200, a gate dielectric layer (not illustrated) may be formed on the sidewall of the trench. In addition, an N-type source region 410 and a P-type body contact region 420 are formed in the P-type body region 220. In addition, a DMOS source contact plug 710, electrically connected to the N-type source region 410 and the P-type body contact region 420, is formed. A source metal wiring 810 connected to the DMOS source contact plug 710 is formed. A drain metal wiring 820 connected to the drain contact plug 600 is formed.

Figure 2:
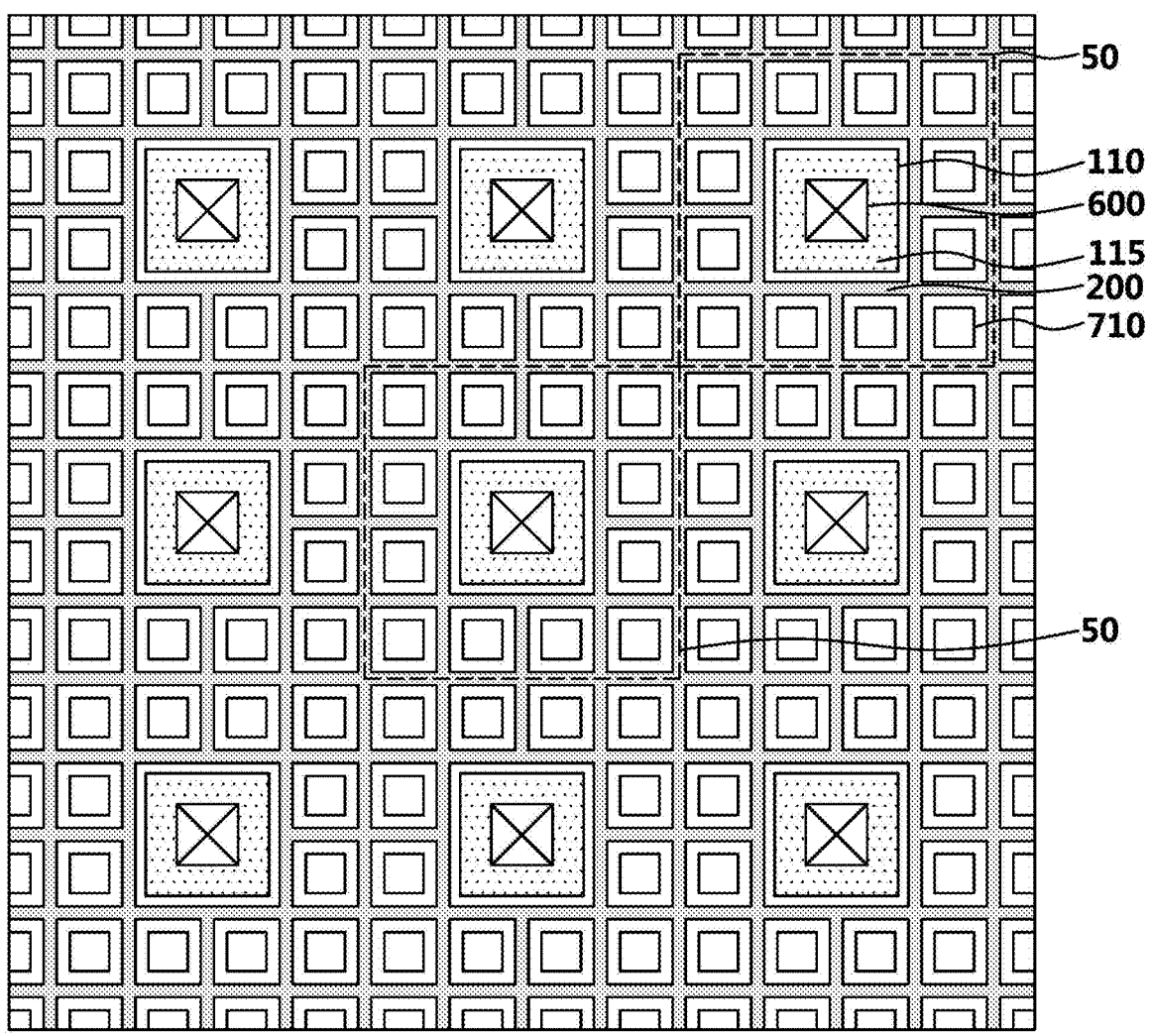
FIG. 2 is a plan layout illustrating a plurality of unit cells of a DMOS semiconductor device, according to one or more examples.

FIG. 2 is a plan layout illustrating a plurality of unit cells of a DMOS semiconductor device according to one or more examples of the present disclosure.

As illustrated in FIG. 2, the basic unit of the DMOS device 10 may be defined as one unit cell. Unit cells 50 gather to form a DMOS device.

One unit cell 50 includes one DMOS drain contact plug 600 and a plurality of DMOS source contacts (or DMOS source contact plugs) 710. In this example, only one DMOS drain contact plug 600 is illustrated at the center of the unit cell 50, but in another example, at least two or more one DMOS drain contact plug 600 may be disposed in the unit cell 50. For example, the unit cell 50 includes one drain contact plug 600 and twelve source contacts 710. The DMOS device 10 is made of several such unit cells 50. The number of unit cells may vary depending on the size and performance of the DMOS device 10. One DMOS drain contact plug 600 is located at the center of the unit cell 50. A plurality of DMOS source contacts 710 surrounds one DMOS drain contact plug 600. In addition, the DMOS drain contact plug 600 occupies an area larger than the DMOS source contact 710. This is because the diameter of the DMOS drain contact plug 600 is several times greater than the diameter of the DMOS source contact 710. One of the trench gates 200 is formed between the DMOS drain contact plug 600 and one of the DMOS source contact plugs 710. Also, another of the trench gate 200 is formed between the DMOS drain contact plug 600 and another of source contact plugs 710. Also, the trench gate 200 is formed between the DMOS source contact 710 and another DMOS source contact 710. The trench gate 200 surrounds the drain contact plug 600. The source contact plug 710 includes a plurality of source contact plugs, and in a plan view, the plurality of source contact plugs 710 surrounds the drain contact plug 600, and the drain contact plug 600 may be located at the center of the plurality of source contact plugs 710.

Figure 3A:
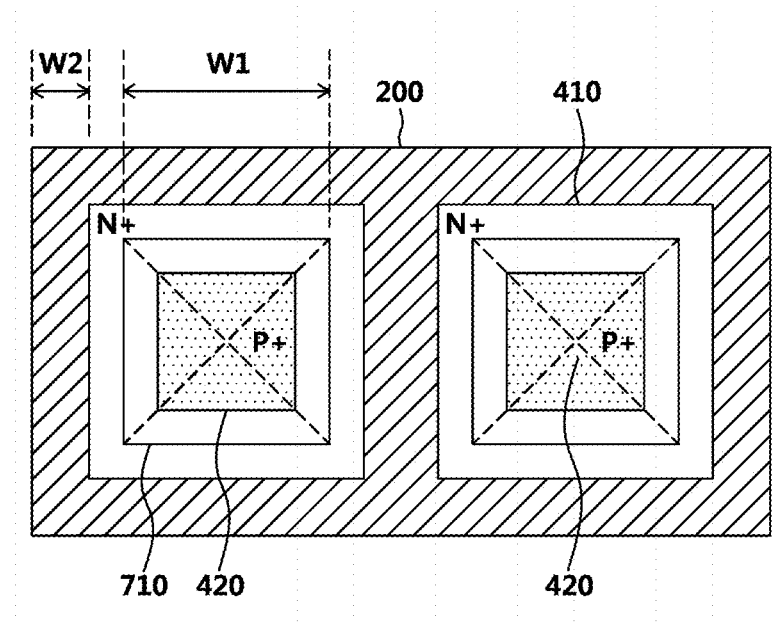
FIGS. 3A and 3B are plan layouts illustrating a source contact plug and a drain contact plug, according to one or more examples.
Figure 3B:
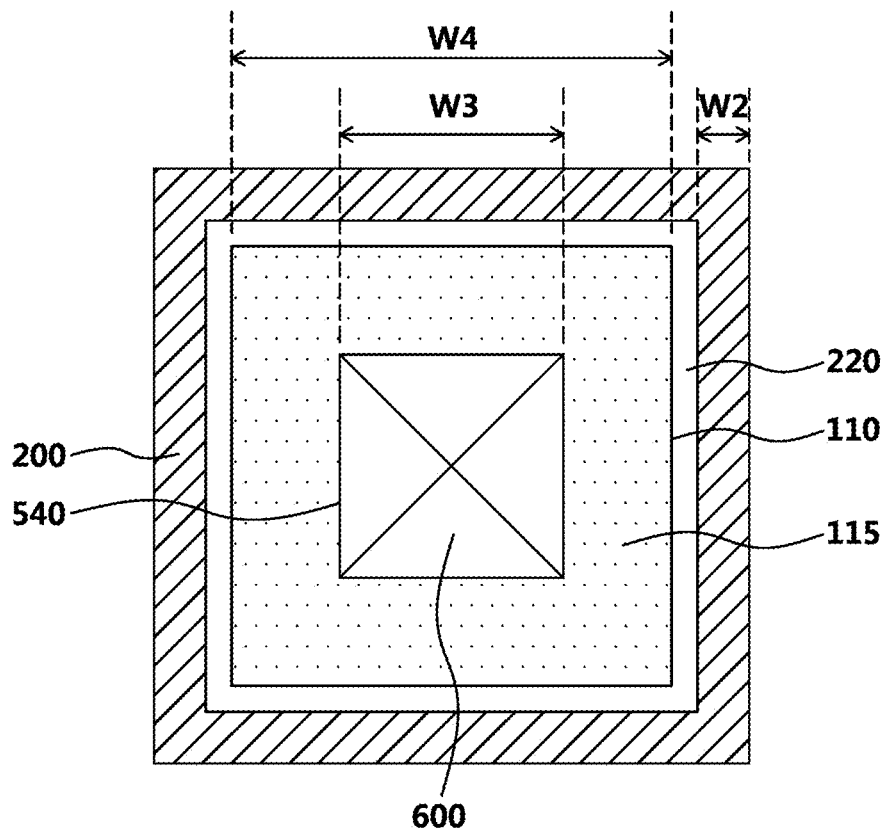

FIGS. 3A and 3B are plan layouts illustrating a source contact plug and a drain contact plug according to one or more examples of the present disclosure.

FIG. 3A illustrates a source contact plug 710 with a first high-concentration N+ doped region 410 and a second high-concentration P+ doped region 420. The first high-concentration N+ doped region 410 and the second high-concentration P+ doped region 420 are formed in the trench gate 200 having a width of W2. In this example, W2 may also mean a distance between the N+ doped regions 410. The trench gate 200 has a structure that is connected to each other like a mesh using one trench. In this example, the first high-concentration N+ doped region 410 is a source region, and the second high-concentration P+ doped region 420 is a body contact region 420. In this example, the first high-concentration N+ doped region 410 surrounds the second high-concentration P+ doped region 420. A DMOS source contact plug 710, which simultaneously contacts the first high-concentration N+ doped region 410 and the second high-concentration P+ doped region 410, is formed. In FIG. 3A, the region indicated by the diagonal dotted line is an area of the DMOS source contact plug 710. The DMOS source contact plug 710 is formed to completely cover the P+ doped region 420 and to partially overlap the N+ doped region 410. The DMOS source contact plug 710 is in contact with the boundary between the first high-concentration N+ doped region 410 and the second high-concentration P+ doped region 420. In this example, the source contact plug 710 has a width W1. Therefore, the DMOS source contact plug 710 has a width smaller than the width of the N+ source region and larger than the width of the P+ body contact region 420.

FIG. 3B illustrates a drain contact plug 600 with a middle trench 110, and a drain contact hole 540. The drain contact plug 600 is located at the center of the middle trench 110 and the middle trench 110 surrounds the drain contact plug 600. The middle trench 110 is filled with a gap-fill dielectric material 115. Therefore, the drain contact plug 600 is formed in the drain contact hole 540 and is surrounded by the gap-fill dielectric layer 115. Thus, the drain contact plug 600 may be electrically insulated from the substrate 100 or the body contact region 220. The middle trench 110 has a width of W4, and the drain contact plug 600 has a width of W3. The width W3 of the drain contact plug 600 is at least equal to or greater than the width W1 of the source contact plug 710. In addition, the widths of the DMOS drain contact plug 600 and the DMOS source contact 710 are greater than the width W2 of one trench gate 200.

Figure 4:
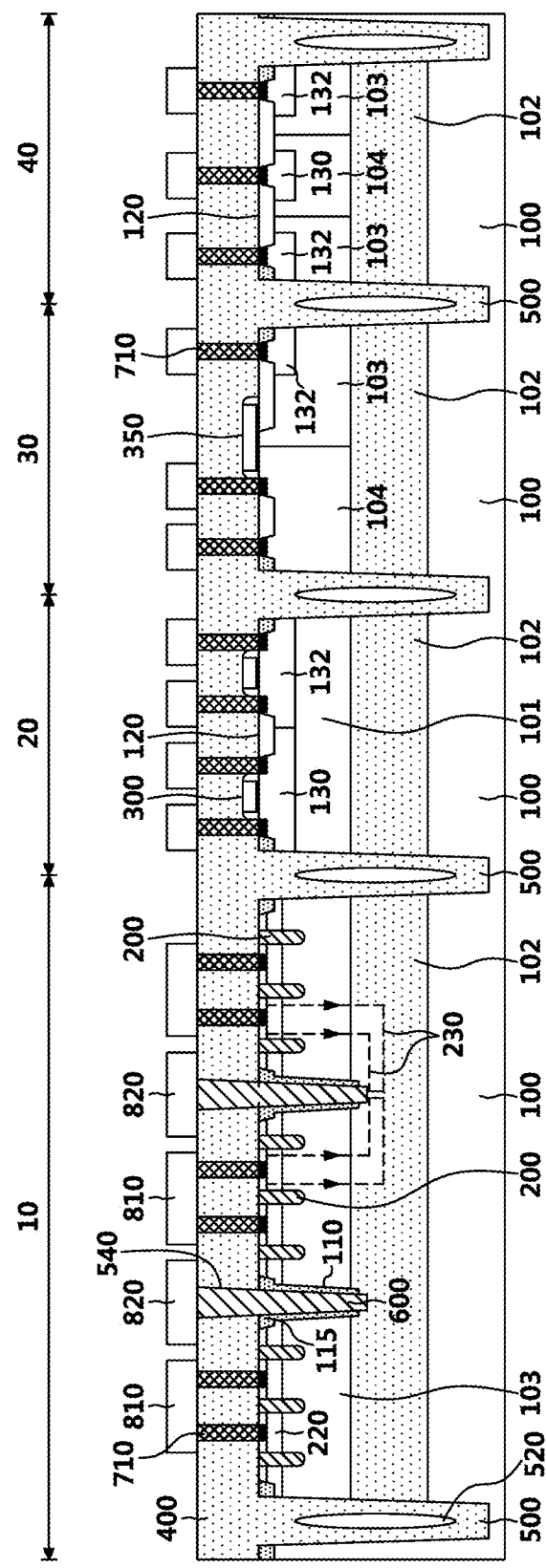
FIG. 4 is a diagram illustrating a cross-section of semiconductor devices, including a vertical DMOS semiconductor, according to one or more examples.

FIG. 4 is a diagram illustrating a cross-section of a semiconductor device according to one or more examples of the present disclosure. The present disclosure is of a semiconductor device comprising BCD devices, and a plurality of semiconductor devices included in one semiconductor substrate. As illustrated in the figure, a Double-Diffused Metal-Oxide-Semiconductor (DMOS) device 10, a Complementary Metal-Oxide-Semiconductor (CMOS) device 20, an extended drain MOS (EDMOS) device 30, and a bipolar junction transistor (BJT) device 40 are included in a semiconductor device. The devices 10, 20, 30, and 40 may be formed side by side in a horizontal direction.

Referring to FIG. 4, the DMOS device 10 is formed in the semiconductor substrate 100. A description thereof is omitted as the DMOS device 10 is previously described above in detail.

Referring to FIG. 4, in the semiconductor device, a CMOS device 20, an EDMOS device 30, and a BJT device 40 are formed side by side on a side surface of the DMOS device 10. Each device 10, 20, 30, 40 is isolated from each other by a deep trench 500. That is, an active region, which is a region in which the DMOS device 10, the CMOS device 20, the EDMOS device 30, and the BJT device 40 are formed, is divided. The deep trench 500 may be formed to a depth of 10-30 μm. The device isolation layers 500 have the same depth as each other.

Referring to FIG. 4, the CMOS device 20, the EDMOS device 30, and the BJT device 40 are formed on a semiconductor substrate 100. In this example, the semiconductor substrate 100 may be a P-type or N-type silicon substrate. In another example, a substrate wherein an epi-layer is formed may be used for a P-type or N-type silicon substrate. In yet another example, an SOI substrate, including a buried oxide layer (BOX) may be used.

The CMOS device 20 may be formed on the N-type buried doped layer 102, which is a high-concentration doped region in the semiconductor substrate 100. A P-type epi-layer 101 is formed on the N-type buried doped layer 102, and a P-type well region (PW) 130 and an N-type well region (NW) 132 are formed on the P-type epi-layer 101. The areas occupied by the P-type well region 130 and the N-type well region 132 may be the same or different. For example, the area of the P-type well region 130 and the N-type well region 132 may be larger or smaller than the other in the semiconductor substrate 100. The CMOS device 20 includes a first gate electrode and a second gate electrode indicated by reference numeral 300. The first gate electrode and the second gate electrode 300 are located on the P-type well region 130 and the N-type well region 132, respectively. The first gate electrode and the second gate electrode are spaced apart from the P-type well region 130 and the N-type well region 132, respectively, by a gate dielectric layer provided in the lower part. Spacers are formed on the left and right sidewalls of the first and second gate electrodes 300. A shallow trench 120 is formed between, and to isolate, the first gate electrode and the second gate electrode 300. In addition, a high-concentration source/drain doped region is formed on each side of the gate electrode. In each of the high-concentration doped regions, CMOS source/drain contact plugs are formed, respectively, and the CMOS source/drain contact plugs are connected to metal wirings thereon. The CMOS source/drain contact plug and the DMOS source contact plug 710 are formed simultaneously in the same operation.

As illustrated in FIG. 4, the EDMOS device 30 includes a semiconductor substrate 100 and an N-type buried doped layer (NBL) 102, which is a high-concentration doped region in the semiconductor substrate 100. Two well regions are formed on the N-type buried doped layer 102. The two well regions are an N-type drift region 103 and a P-type low-concentration well (DPW) region 104. The area occupied by any one of the regions 103 and 104 in the semiconductor substrate 100 may be larger or smaller than the other. An N+ source region and a P+ contact region are formed in the DPW region 104 with a shallow device isolation layer therebetween. An N-type well (NW) region 132 is formed in the N-type drift region 103. The concentration of the N-type drift region 103 is lower than that of the NW region 132. A high-concentration N+ drain region is formed in the NW region 132. The high-concentration N+ drain region is generated spaced apart from the spacer of the gate electrode 350 at a predetermined distance in order to increase the breakdown voltage. Because the concentration of the high-concentration N+ drain region is the highest and the concentration of the NW region 132 is higher than that of the N-type drift region 103, the electric field is relaxed in both horizontal and vertical directions. A device isolation layer is positioned between the NW region 132 and the gate electrode 350. The device isolation layer is formed from under the gate electrode 350 to the NW region 132, and in contact with the high-concentration N+ drain region. Spacers are formed on the left and right sidewalls of the gate electrode 300, the spacer located in the DPW region 104 is in contact with the N+ source region, and the spacer located in the N-type drift region 103 overlaps the device isolation layer.

In FIG. 4, the BJT device 40 includes a semiconductor substrate 100 and an N-type buried doped layer (NBL) 102, which is a high-concentration doped region in the semiconductor substrate 100. Three well regions are formed on the N-type buried doped layer 102. The three well regions are a P-type low-concentration well (DPW) region 104 and an N-type low-concentration well region 103 located on the left/right sides of the DPW region 104. Each of the regions 103 and 104 may occupy a different or same area in the semiconductor substrate 100. A P-type well (PW) region 130 is formed in the DPW region 104. The concentration of the PW region 130 is higher than that of the DPW region 104. In addition, an N-type well (NW) region 132 is formed in the N-type low-concentration well region 103. A device isolation layer is formed between the PW region 130 and the NW region 132. The N-type low-concentration well region 103 of the BJT device 40 and the N-type drift region 103 of the EDMOS device 30 are formed at the same concentration in the same operation.

FIGS. 5 to 15 are process diagrams illustrating a method of manufacturing a BCD semiconductor device, including a trench gate type DMOS device according to one or more examples of the present disclosure.

Figure 5:
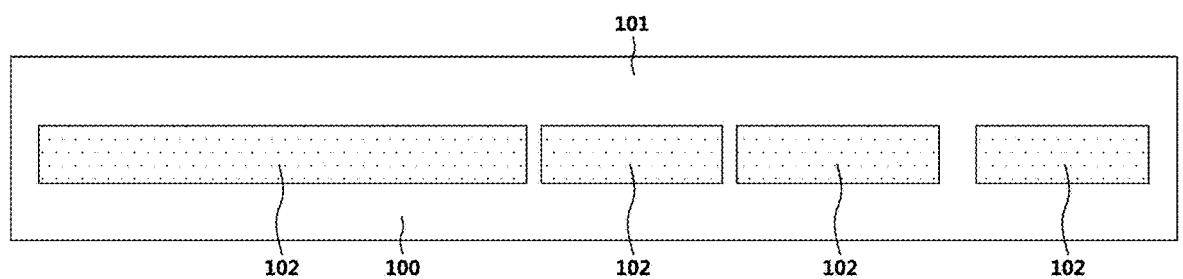
FIGS. 5 to 13 are process diagrams illustrating a method of manufacturing a semiconductor device having a vertical DMOS device, according to one or more examples.

Referring to FIG. 5, a buried doped layer 102 and a P-type epi-layer 101 are formed in the semiconductor substrate 100. The substrate 100 and the epi-layer 101 are of the same conductivity type, and the buried doped layer 102 is of a different conductivity type. The substrate 100 may be an epi-layer 101 or a silicon substrate. For example, the substrate 100 may be a P-type silicon substrate, and the buried doped layer 102 may be a layer doped with an N-type impurity. The buried doped layer 102 is formed long in the horizontal direction in the middle of the substrate 100, and not formed continuously, but formed spaced apart at a constant distance with respect to the unit devices 10, 20, 30, 40 to be formed in the semiconductor device. That is, the first to fourth unit devices 10, 20, 30, 40 are a DMOS device, a CMOS device, an EDMOS device, and a BJT device, and the devices 10, 20, 30, and 40 are installed spaced apart by a device isolation film for electrical insulation, and the buried doped layer 102 is also formed spaced apart like the devices 10, 20, 30, 40. When forming the buried doped layer 102, the buried doped layer is formed only in a predetermined region using a mask pattern (not illustrated) for forming the buried doped layer.

Figure 6:
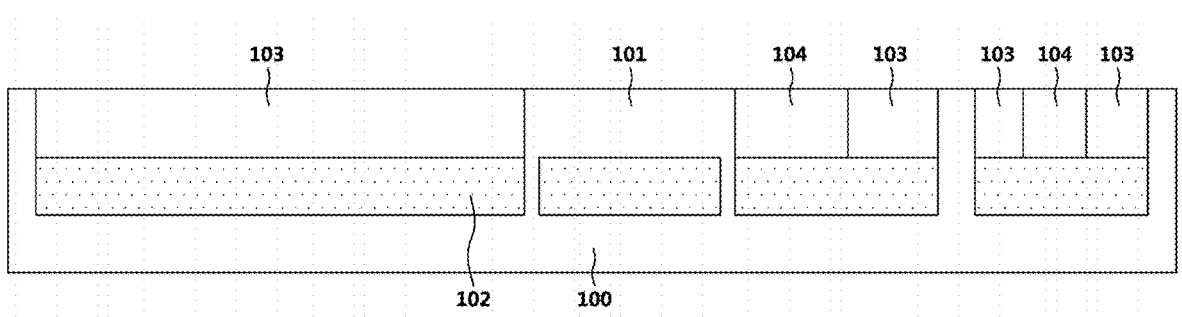

Referring to FIG. 6, a low-concentration well region is formed in a part of the P-type epi-layer 101. The low-concentration well region may be formed of different concentrations according to the characteristics of the unit devices 10, 30, and 40. As illustrated in FIG. 6, an N-type drift region 103 is formed in the region where the DMOS device 10 is to be formed. The N-type drift region 103 is formed while being in contact with the buried doped layer 102. Two well regions are formed in the EDMOS device 30. The two well regions are the N-type drift region 103 and the P-type low-concentration well (DPW) region 104, and the area occupied by each well region 103 and 104 in the semiconductor substrate 100 may be formed to have one side greater or smaller than the other side. In the BJT device 40, a P-type low-concentration well (DPW) region 104 is formed in the center, and an N-type drift region 103 is formed on the left/right side thereof. The N-type low-concentration well region 103 may be formed, and the P-type low-concentration well (DPW) region 104 may be formed. Or it can be formed in the reverse order.

FIGS. 7A to 7E illustrate a process of forming an isolation. A plurality of isolation regions is formed on the substrate on which the well regions are formed, as illustrated in FIG. 6. The isolation region may be formed to have the desired depth for isolating devices, and STI or medium trench isolation (MTI) deep trench isolation (DTI) may be used. As an isolation region, the STI is a trench formed thinly on the surface of the substrate to isolate the device and well regions. MTI refers to a trench (i.e., a middle trench) formed relatively deeper to form a drain contact region. A process of forming a plurality of isolation regions on a substrate is described.

Figure 7A:
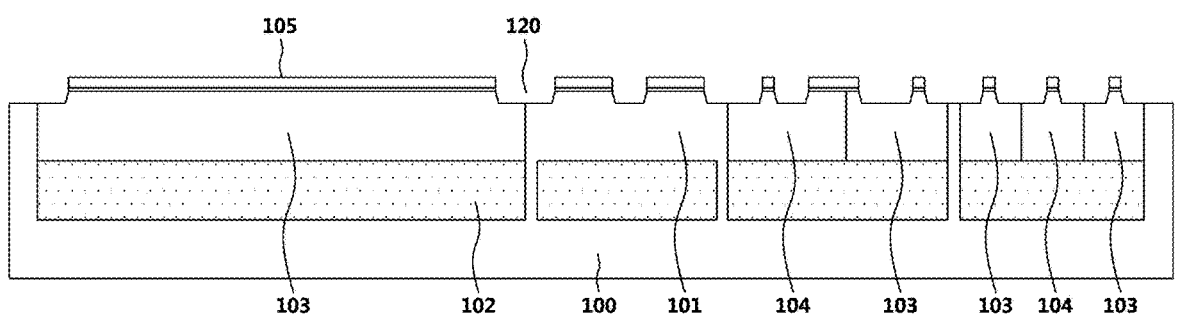

As illustrated in FIG. 7A, a shallow trench 120 is formed by using the first mask pattern 105. Because the isolation region formed on the substrate 100 may have a different size (width), a mask pattern having a shape corresponding thereto is to be provided.

Figure 7B:
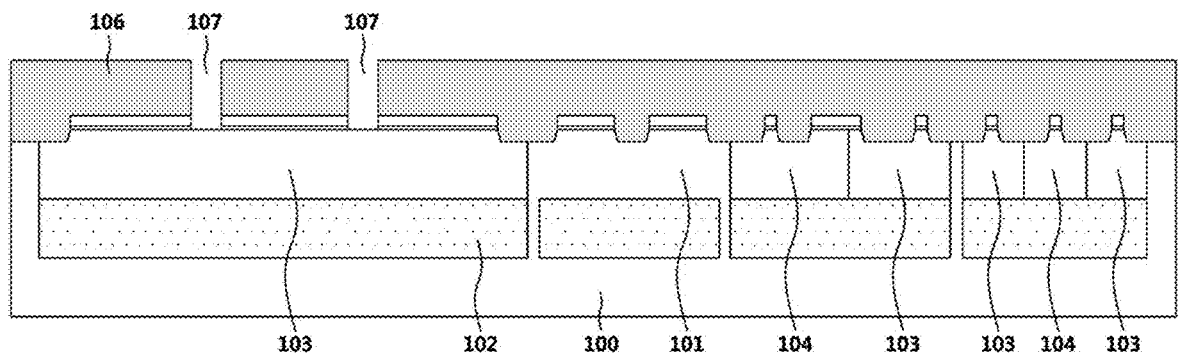

As illustrated in FIG. 7B, a second mask pattern 106 is formed with respect to the entire surface of the substrate 100. The second mask pattern 106 may fill the shallow trench 120 region. In addition, a second mask pattern 106 is removed from the region 107 in which the DMOS middle trench 110 is to be formed. Through the removed portion, the upper surface of the substrate 100 is exposed to the outside.

Figure 7C:
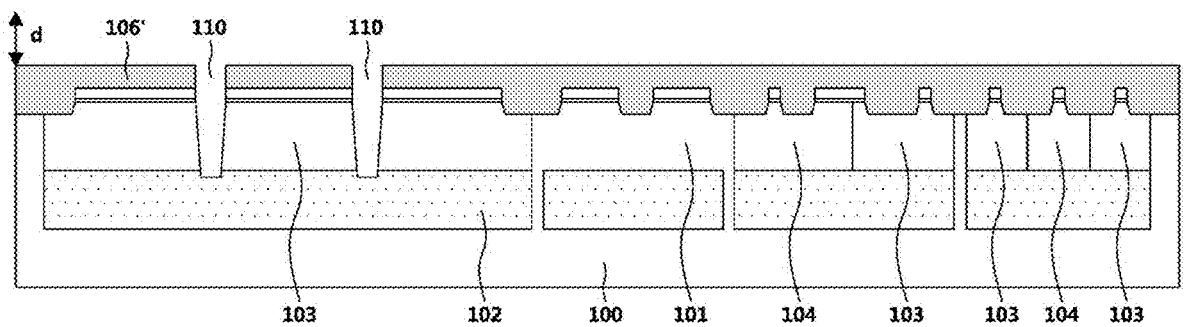

As illustrated in FIG. 7C, a middle trench 110 is formed in an area where a DMOS drain contact is to be formed. The middle trench 110 is formed from the surface of the substrate 100 and extends through the N-type drift region 103 to be in contact with the buried doped layer 102 or to be extended slightly below the buried doped layer 102. The middle trench 110 may be removed from the substrate by various methods, e.g., wet etching or dry etching. Because the degree of etching decreases depending on the depth to be removed, the middle trench 110 is formed to have a narrower width as depth progresses. In addition, compared with FIG. 7B, 'd' sized portion is removed from the upper portion of the second mask 106 so that only a portion 106' remains. The thickness of the mask pattern is made thinner by the etching process. After the middle trench 110 is formed, the mask is removed.

Figure 7D:
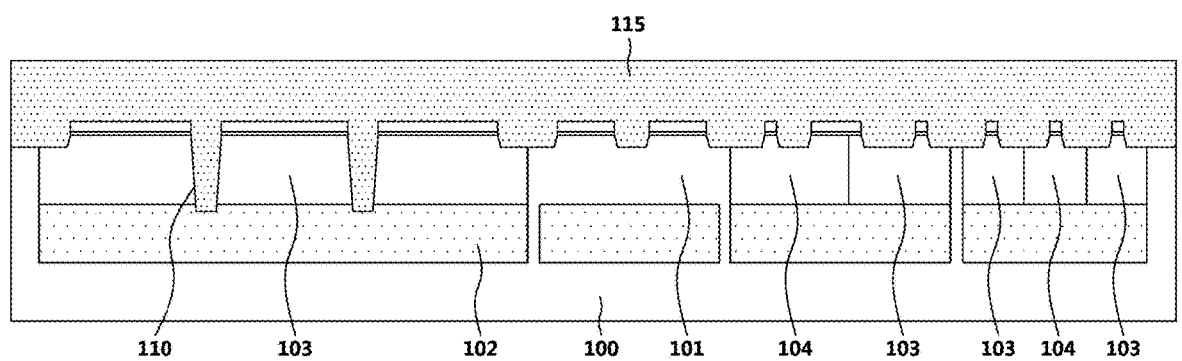

FIG. 7D illustrates a state in which a gap-fill dielectric material 115 is deposited on the entire substrate, including the middle trench. The shallow trench 120 and the middle trench 110 are filled by the gap-fill dielectric material 115. The gap-fill dielectric material 115 may be deposited by various methods, but may be deposited by, for example, a chemical vapor deposition (CVD) process, HDP CVD (High Density Plasma CVD) process, etc. The gap-fill dielectric material 115 may be a silicon oxide layer deposited by a HDP CVD (High Density Plasma CVD) process. A material used to form the interlayer dielectric layer 400 may also be a silicon oxide layer using a TEOS material. Therefore, the gap-fill dielectric material 115 and the interlayer dielectric layer 400 may not be distinguished from each other. This is because all of them are made of an oxide layer.

Figure 7E:
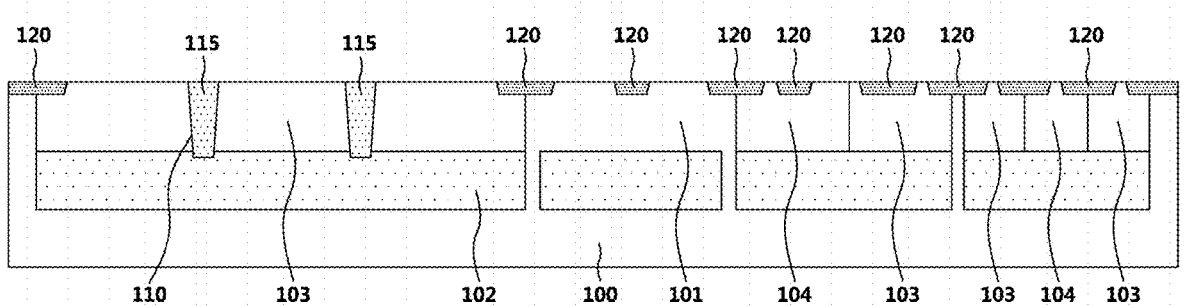

Referring to FIG. 7E, the upper surface of the gap-fill dielectric material 115 is planarized by a CMP (Chemical Mechanical Planarization) process. As a result, the middle trench 110 isolation and the shallow trench 120 isolation, which are the isolation regions, are formed in the semiconductor substrate.

Figure 8:
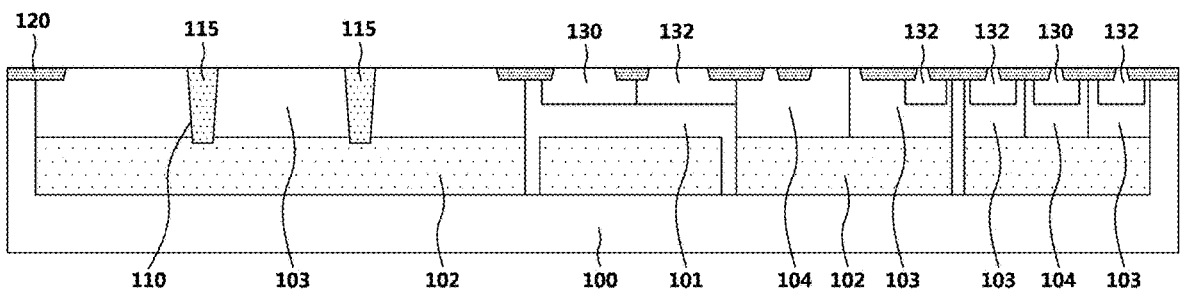

FIG. 8 is a process of forming a low voltage (LV) well region, which is a second well region, in some regions of the substrate 100. Referring to FIG. 8, a PW region 130 and an NW region 132 are formed in the P-type epi-layer 200 of the CMOS device 20. In addition, the NW region 132 is formed in the N-type drift region 103 of the EDMOS device 30, and the BJT device 40 forms the PW 130 in the DPW region 104, and NW 132 is formed in the N-type low-concentration well region 103. The second well regions 130 and 132 are higher concentration doped regions than the first well regions 103 and 104 and are formed to be relatively thin on the surface of the substrate 100.

Figure 9:
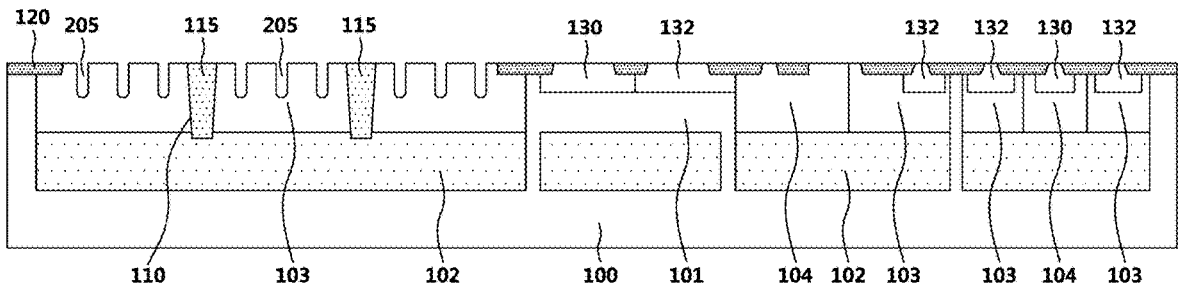

FIG. 9 illustrates a process of forming a trench for forming a trench gate electrode of the present disclosure. As illustrated in FIG. 9, a plurality of trenches 205 for forming a trench gate electrode are formed in the N-type drift region 103 of the DMOS device 10. The trenches 205 are all formed equally at a predetermined depth on the surface of the substrate 100 and are arranged to be uniformly spaced apart. The trench 205 is formed deeper than the shallow trench 120, and it is thinner than the middle trench 110 for the DMOS drain contact. The trenches 205 are located in the N-type drift region 103.

Figure 10:
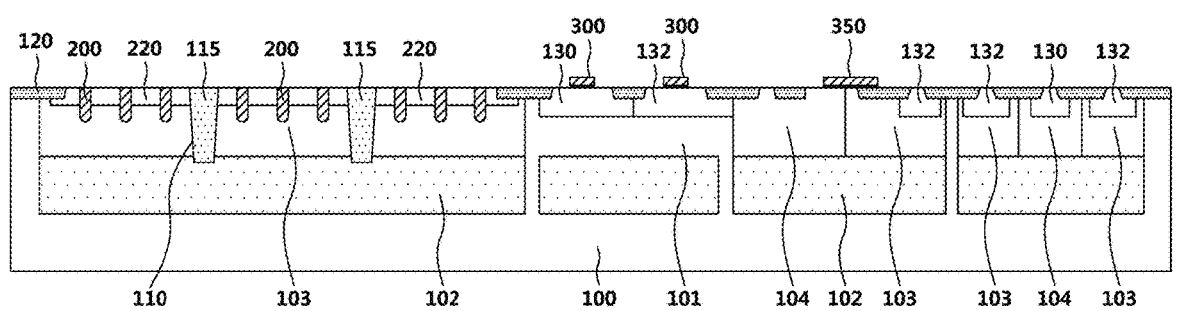

FIG. 10 illustrates a process of forming a P-type body region, a trench gate, and a trench gate electrode of the present disclosure.

Referring to FIG. 10, a gate dielectric layer and a conductive film (not illustrated) are deposited on the entire surface of the substrate 100, including the trench 205, for the formation of a trench gate electrode. In this example, a metal material such as polysilicon, Al, Cu, or W may be used as a conductive layer 210. In addition, a mask pattern for the body region (not illustrated) is formed on the surface of the previously deposited conductive layer 210. Then, ion implantation is performed so as to pass through the conductive film toward the substrate for the formation of a P-type body region 220. Thus, the P-type body region 220 may be formed on the substrate to a predetermined depth. The P-type body region 220 becomes a channel region. The depth of the P-type body region 220 is deeper than the shallow trench 120 and thinner than the trench gate (or trench gate electrode) 200. The gate dielectric layer (not illustrated) and the trench gate electrode 200 are formed in the trench 205 by etching the deposited conductive layer. A planarization process, such as CMP, is performed to form the trench gate electrode inside the trench 205, instead of etching the deposited conductive layer. The conductive film deposited on the other region 20 and 30 is patterned to form CMOS gate electrodes 300 and an EDMOS gate electrode 350. Therefore, the trench gate electrode 200 is formed in the vertical DMOS device 10. The CMOS gate electrodes 300 and an EDMOS gate electrode 350 are formed in the CMOS device and the EDMOS device regions 20 and 30, respectively. In the CMOS device 20, the CMOS gate electrodes 300 are formed on the PW region 130 and the NW region 132, respectively. The CMOS gate electrodes 300 are insulated from the PW region 130 and the NW region 132 by the gate dielectric layer. Further, the EDMOS gate electrode 350 in the EDMOS device 30 is formed on the DPW region 104 and the N-type drift region 103.

Figure 11:
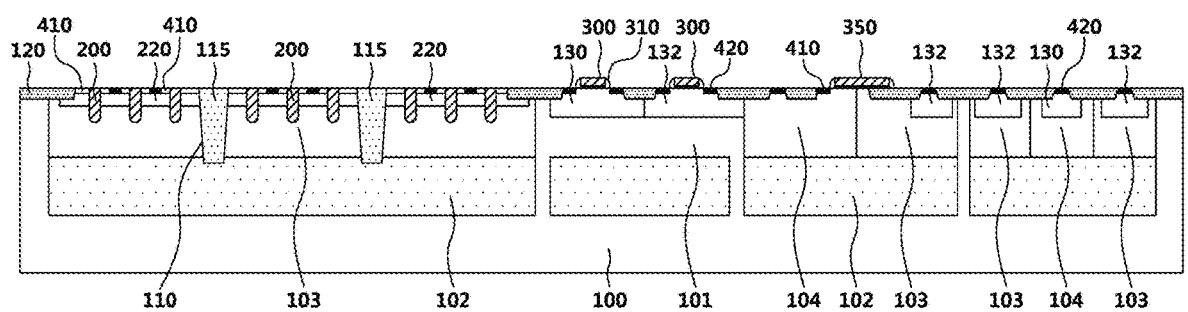

Referring to FIG. 11, an LDD region (not illustrated) is formed on a substrate, and spacers 310 are formed on both sidewalls of the gate electrode 300. In addition, an N+ doped region 410 and a P+ doped region 420 are formed in the DMOS 10, CMOS 20, and EDMOS 30, respectively. In addition, a well pickup region or the like may be formed. The N+ doped regions 410 are formed in the DMOS 10, CMOS 20, and EDMOS 30, respectively, by simultaneously performing the same ion implantation conditions in the same operation. Similarly, the P+ doped region 420 is formed by performing the same ion implantation conditions in the same operation.

Figure 12:
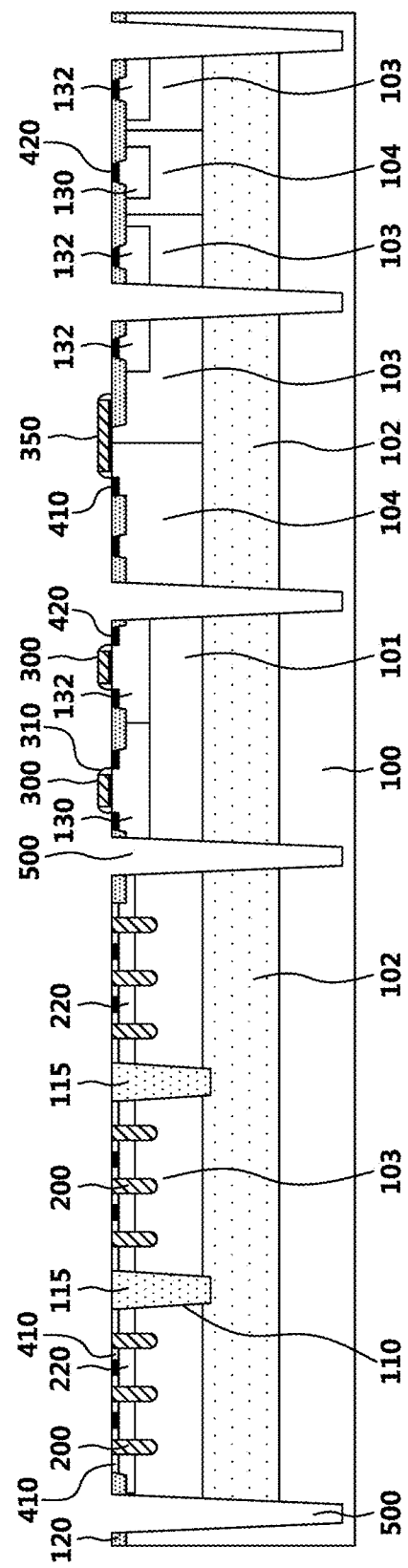

FIG. 12 illustrates a process of forming a deep trench 500. As illustrated, a deep trench 500 is formed in the substrate to isolate between the DMOS device 10, the CMOS device 20, the EDMOS device 30, and the BJT device 40 formed on the substrate 100. In addition, the structure of the deep trench 500 may be formed to overlap the structure of the shallow trench (STI) 120. That is, the deep trench 500 structure may be formed by etching the area in which the shallow trench 120 is formed and by additionally etching the substrate 100. The formation of the deep trench (DTI) 500 is performed after the formation of the gate electrode and source/drain regions. The depth of the deep trench 500 is greater than that of the trench gate 200 and the middle trench 110. The depth of the deep trench 500 has a depth of about 5-30 um. Therefore, the deep trench 500 is formed from the upper surface to the lower region of the substrate 100 to completely divide between the devices 10, 20, 30, and 40. In addition, the deep trench 500 is formed deeper than the bottom surface of the buried doped layer 102. Thus, the deep trench 500 may electrically isolate the buried doped layer 102 and the adjacent buried doped layer 102.

Figure 13:
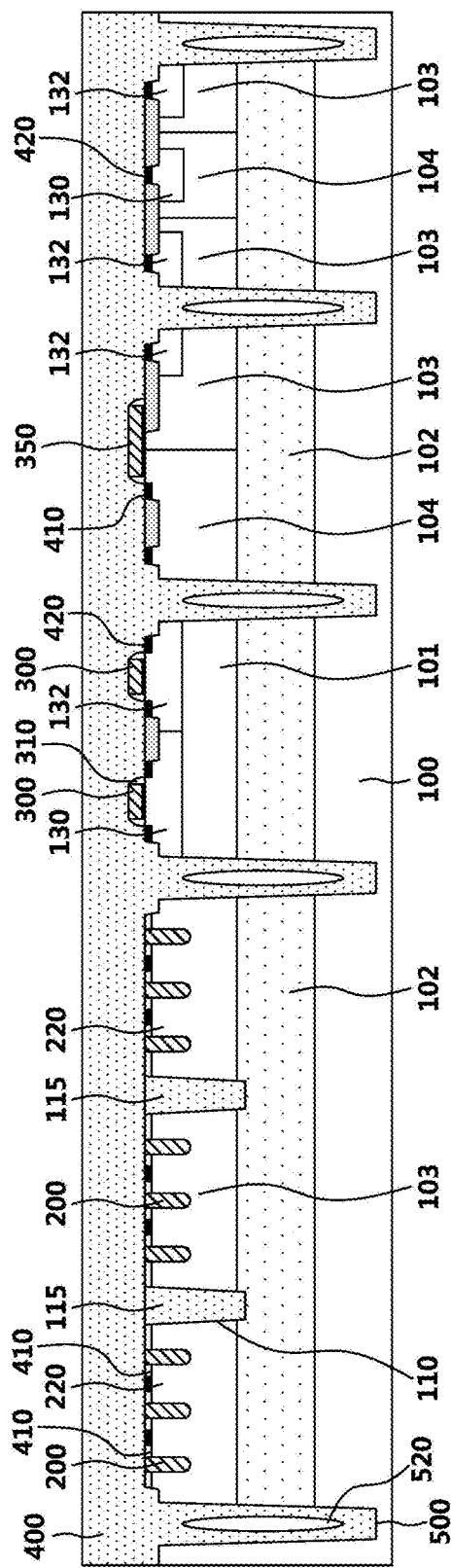

FIG. 13 illustrates a process of depositing an interlayer dielectric layer in the deep trench 500. As illustrated, the interlayer dielectric layer 400 fills the deep trench 500. In addition, the deep interlayer dielectric layer 400 is also formed on the gate electrodes 300 and 350 and also formed inside the deep trench 500. An air-gap or a void 520 may be formed inside the deep trench 500. When the interlayer dielectric layer is filled, not all of them are filled, so that the void 520 may be formed. In order to improve the gap-fill characteristic before the interlayer dielectric layer 400 is deposited, a sidewall oxide layer (not illustrated), for example, LPCVD oxide layer or TEOS layer, may be formed in advance. For example, BPSG, PSG, or TEOS are used for the material of the interlayer dielectric layer (ILD) 400 using by an LPCVD method or a PECVD method. The BPSG, PSG, and TEOS are all oxide-based materials. As illustrated in FIG. 13, the interlayer dielectric layer (ILD) 400 and the gap-fill dielectric material 115 inside the middle trench 110 may be formed in contact with each other.

FIGS. 14A, 14B, 14C, and 14D illustrate operations of forming a DMOS drain contact plug in the middle trench 110 filled with an insulator.

Figure 14A:
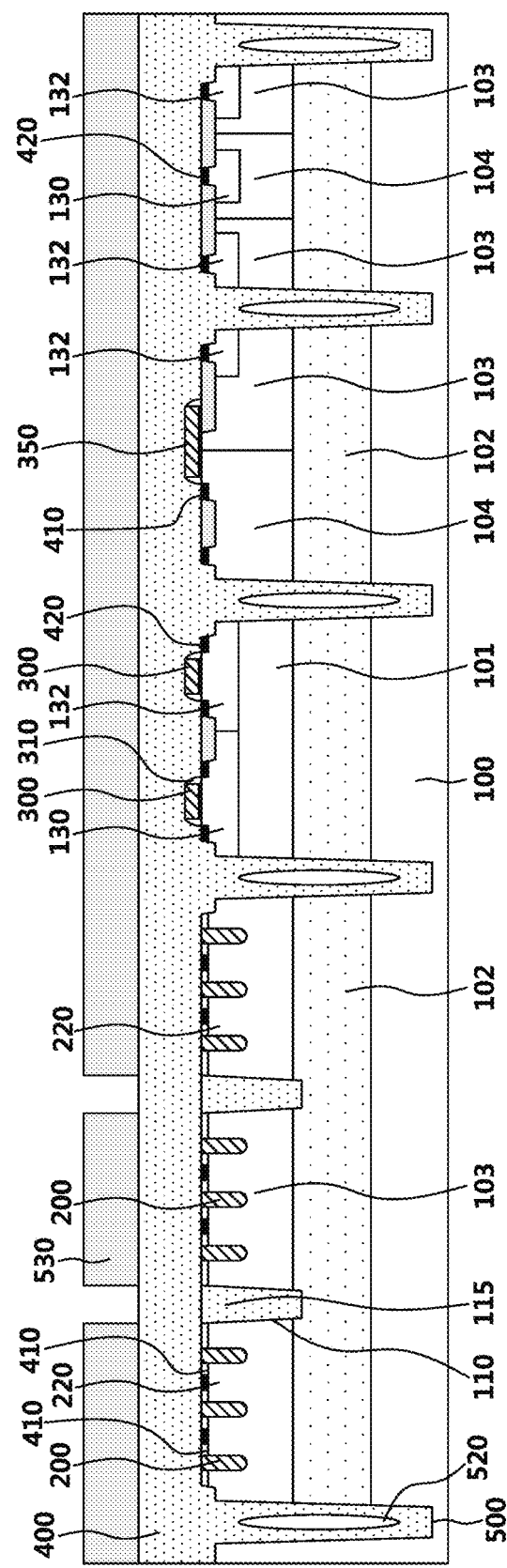
FIGS. 14A, 14B, 14C, and 14D illustrate forming a DMOS drain contact plug, according to one or more examples.

First, referring to FIG. 14A, in order to form the DMOS drain contact plugs 600, a DMOS drain contact mask pattern 530 is formed on the interlayer dielectric layer 400.

Figure 14B:
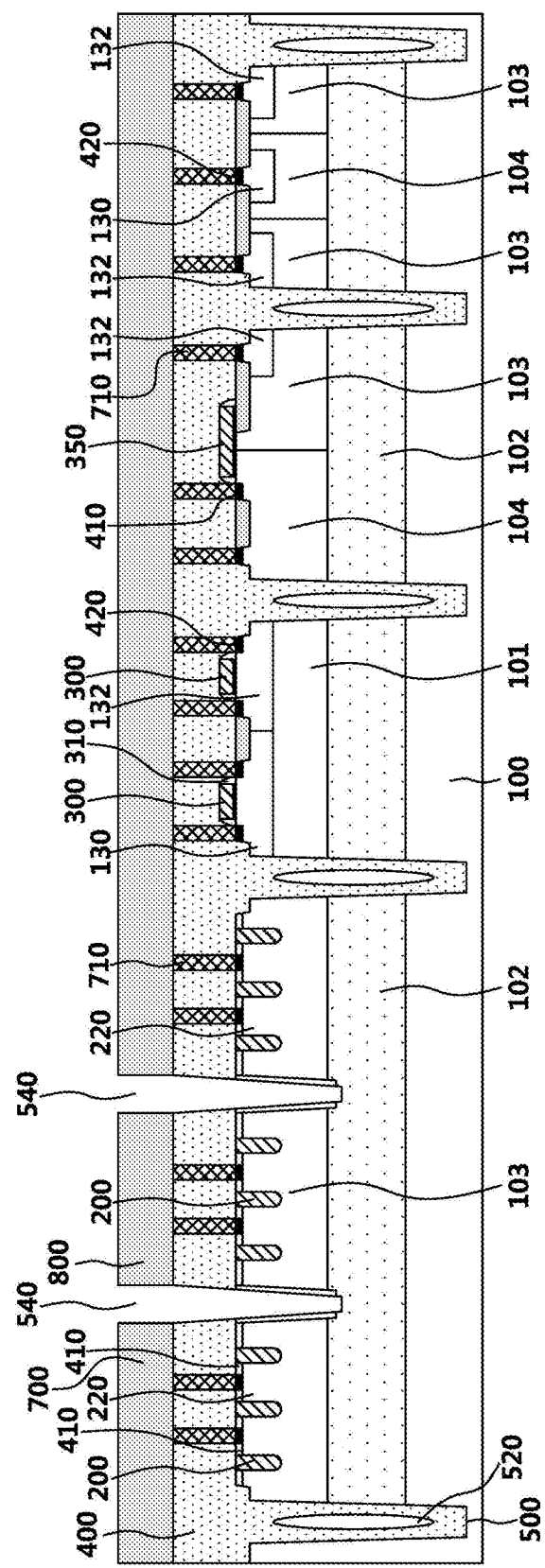

Referring to FIG. 14B, a DMOS drain contact etching process is performed by using the DMOS drain contact mask pattern 530. In this example, a part of the interlayer dielectric layer 400 is etched by the DMOS drain contact etching process. Then, the etching process is continued to etch the gap-fill dielectric material 115 present inside the middle trench 110. Etching is stopped when the buried doped layer 102 formed on the substrate 100 is exposed as the gap-fill dielectric material 115 is removed. Because the gap-fill dielectric material 115 and the buried doped layer 102 have different etching selectivity, the etch stop point can be easily identified. Thus, a DMOS drain contact hole 540 is formed across the interlayer dielectric layer 400 and the substrate 100.

Figure 14C:
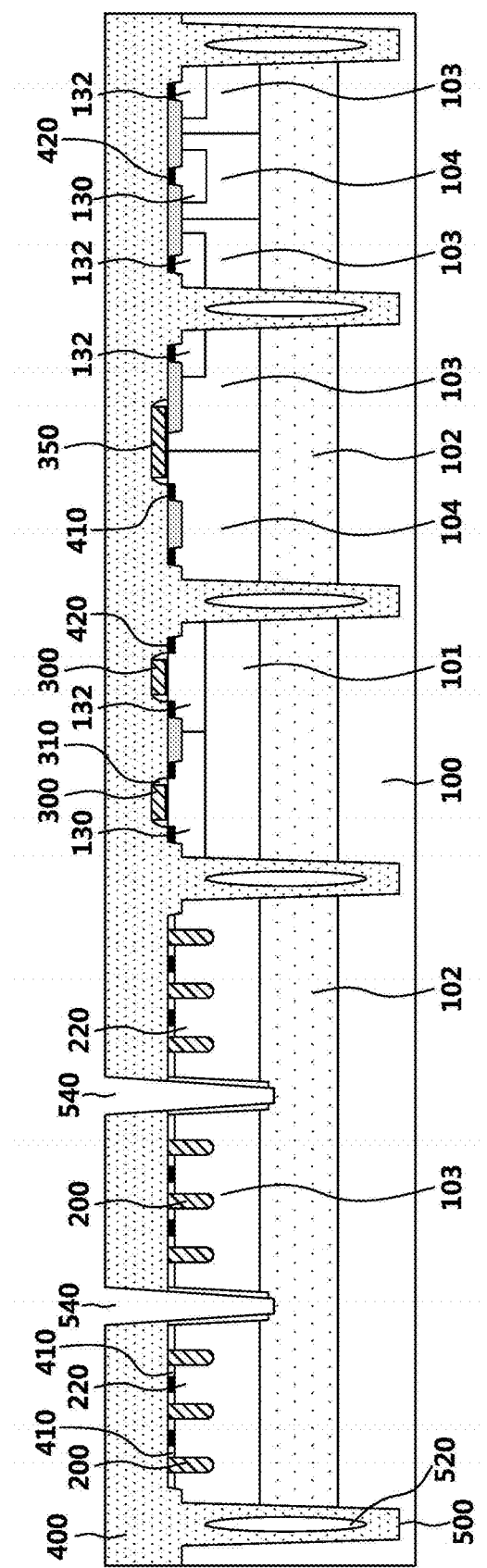

FIG. 14C illustrates the DMOS drain contact mask pattern 530 being removed.

Figure 14D:
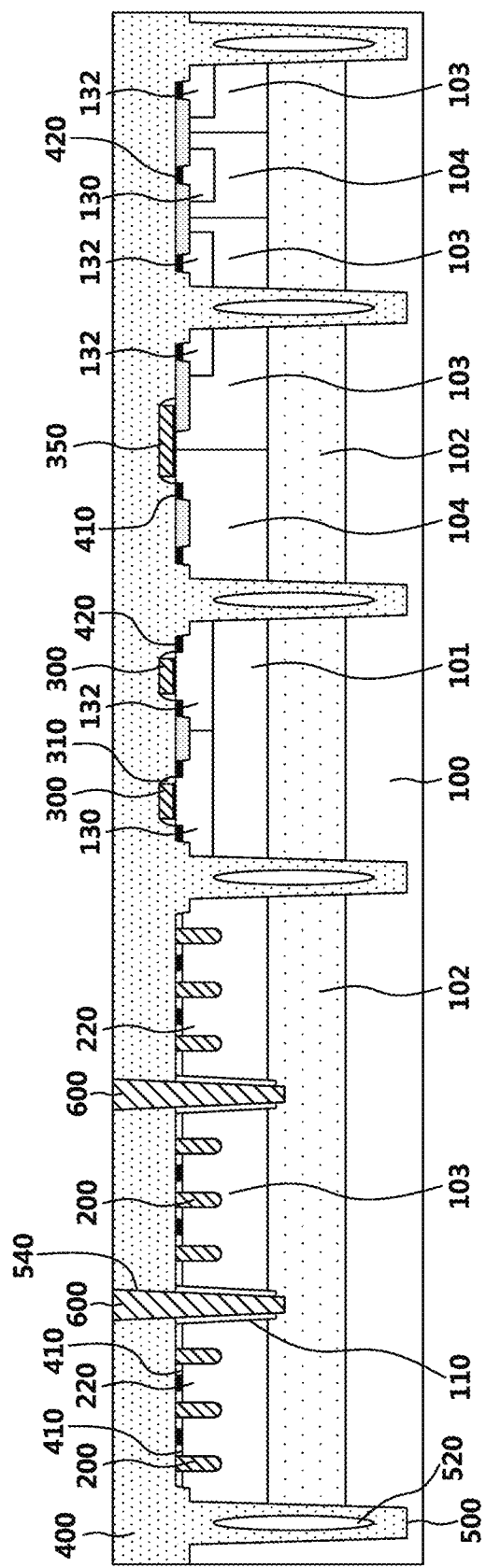

Referring to FIG. 14D, after filling the DMOS drain contact hole 540 with a metal material such as tungsten, the DMOS drain contact plug 600 is formed by using a tungsten CMP process.

Figure 15:
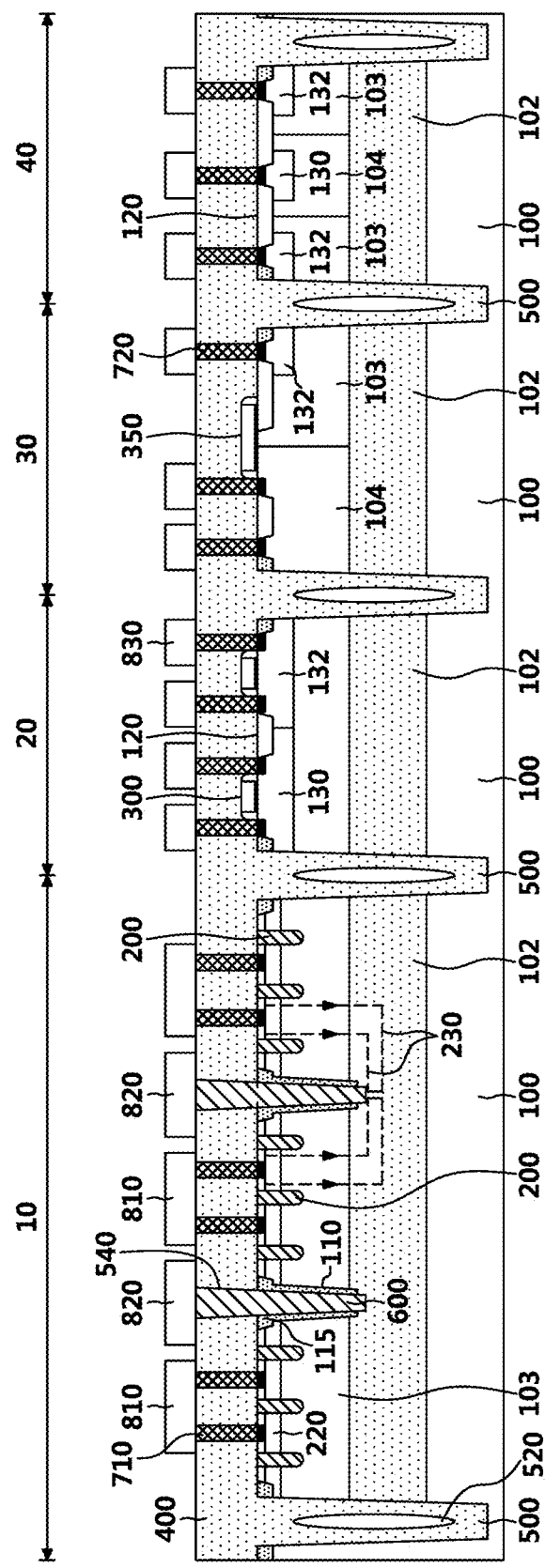
FIG. 15 is a process diagram illustrating a method of manufacturing a semiconductor device having a vertical DMOS device, according to one or more examples.

FIG. 15 illustrates a operation of forming a metal wiring. When the drain contact plug 600 is formed, a DMOS source contact plug 710 is formed. To form the DMOS source contact plug 710, a contact mask pattern (not illustrated) is formed on the interlayer dielectric layer 400. Then, a contact etching process is performed to form a contact hole (not illustrated) in the interlayer dielectric layer 400. A DMOS source contact plug 710 consisting of tungsten is formed by filling the formed contact hole with a metal material such as tungsten. When forming the DMOS source contact plug 710, the CMOS/EDMOS/BJT contact plugs 720 are simultaneously formed in the EDOS 20, CMOS 30, and BJT 40 devices. Therefore, in the end, the DMOS drain contact plug 600 and the DMOS source contact plug 710 having different depths may be formed. In order to form the DMOS drain contact plug 600 and the source contact plug 710 having different depths as described above, at least two contact mask patterns are required.

In this example, the DMOS source contact plug 710 and the DMOS drain contact plug 600 may be manufactured by various methods. For example, the DMOS drain contact plug 600 and the source contact plug 710 may be formed at the same time by performing CMP after filling the hole with a metal material such as tungsten after forming a DMOS drain contact hole 540 and a DMOS source contact hole. In order to do so, a DMOS source contact hole 540 may be formed first, then a DMOS drain contact mask pattern may be formed, and then a DMOS drain contact hole 540 may be formed. Alternatively, conversely, a DMOS drain contact hole 540 may be formed first, then a DMOS source contact mask pattern may be formed, and a DMOS source contact hole may be formed. In the present disclosure, it is described the example is described in the order that a DMOS drain contact hole 540 is formed, a DMOS drain contact plug 600 is formed, a DMOS source contact hole is formed, and then a DMOS source contact plug 710 is formed. The order and manufacturing process can be varied depending on manufacturing cost and feasibility. Further, a source metal wiring (first metal wiring) 810 and a drain metal wiring (second metal wiring) 820 respectively connected to the DMOS source contact plug 710 and the DMOS drain contact plug 600, are formed. A third metal wiring 830 is also formed in the EDOS 20, CMOS 30, and BJT 40 devices. As materials for the first metal wiring 810, the second metal wiring 820, and the third metal wiring 830, Al—Cu, Cu, or the like may be used.

As described above, the present disclosure manufactures a plurality of devices on a semiconductor substrate at once by using BCD technology, and desirably, drain metal wiring (second metal wiring) 820 is formed on a front surface of the substrate, not on a backside of the substrate. In this way, the channel density of the DMOS device can be maximized.

Figure 16:
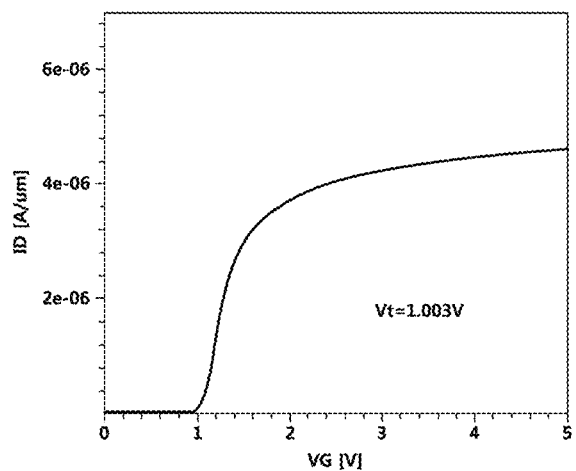
FIG. 16 is an ID-VG graph of a semiconductor device, according to one or more examples.

FIG. 16 is an ID-VG graph of the semiconductor device of the present disclosure. In the semiconductor device, according to one or more examples of the present disclosure, even if the gate voltage VG increases, the drain current ID does not increase before the gate voltage is more than the threshold voltage (VT=1.0V in the example). When the gate voltage VG exceeds the threshold voltage VT, the drain current ID also increases.

Figure 17:
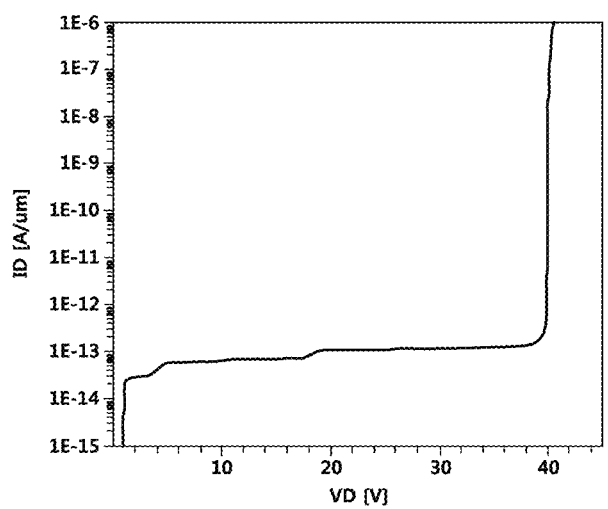
FIG. 17 is a graph of a breakdown voltage according to an operation of a semiconductor device, according to one or more examples.

FIG. 17 is an ID-VD graph according to the operation of the semiconductor device of the present disclosure. In the semiconductor device, according to the example of the present disclosure, the VD voltage has a stable drain current (ID) value up to about 35V, and breakdown occurs at about 40V. Therefore, it can be confirmed that the stable breakdown voltage, which is the target, is obtained.

Figure 18:
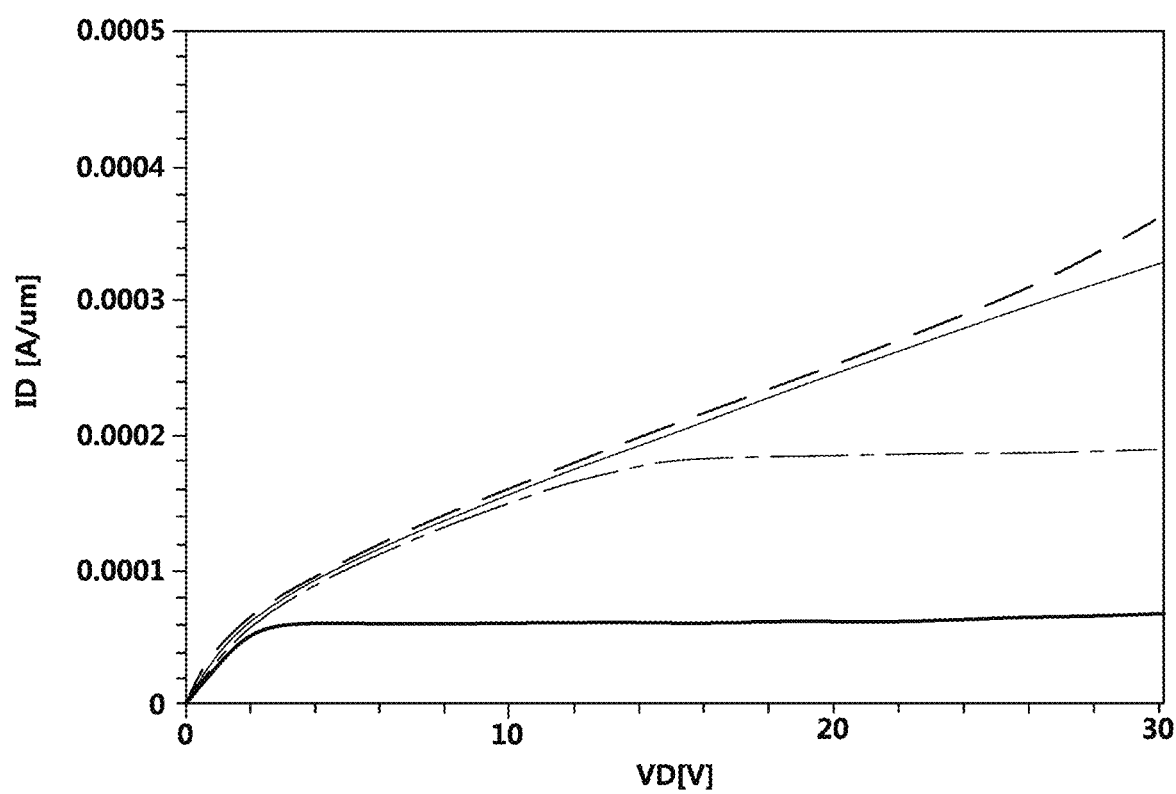
FIG. 18 is an ID-VD graph of a semiconductor device, according to one or more examples.

FIG. 18 is an ID-VD graph of the semiconductor device of the present disclosure by changing the gate voltage. As illustrated, as the gate voltage is changed from 1V to 5V, as a result of measuring voltage and current characteristics of the drain region, voltage and current characteristics of the drain region are normally measured.

According to the semiconductor device having a vertical DMOS and a manufacturing method thereof of the present disclosure as described above, a DMOS device is formed as a trench gate in a semiconductor device using a BCD technology, and the drain contact plug structure is formed starting from the interlayer dielectric layer and extending to the substrate. Therefore, there is an effect of improving the channel density while minimizing the area of the chip.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
    a substrate;
    a buried doped layer formed on the substrate;
    a trench gate formed on the buried doped layer;
    a source region formed adjacent the trench gate;
    an interlayer dielectric layer formed on the trench gate and the source region;
    a source contact plug formed to extend and connect to the source region; and
    a drain contact plug, extending and connecting to the buried doped layer, formed deeper than the source contact plug,
    wherein the trench gate includes a plurality of trench gates surrounding the drain contact plug.

2. The device of claim 1, wherein a bottom surface of the drain contact plug is located deeper than a bottom surface of the trench gate.

3. The device of claim 1, wherein the drain contact plug is formed to extend from the interlayer dielectric layer to the buried doped layer.

4. The device of claim 1, wherein a width of the drain contact plug is greater than a width of the trench gate.

5. The device of claim 1, wherein a width of the drain contact plug is greater than a width of the source contact plug.

6. The device of claim 1, further comprising:
    a drift region formed on the buried doped layer;
    a body region formed in the drift region;
    a body contact region formed in the body region;
    a source metal wiring connected to the source contact plug; and
    a drain metal wiring connected to the drain contact plug,
    wherein the drain contact plug is formed to extend through the body region and the drift region to the buried doped layer.

7. The device of claim 1, wherein the drain contact plug is formed in a drain contact hole.

8. The device of claim 1, further comprising a middle trench filled with a gap-fill dielectric material to surround the drain contact plug and to be in direct contact with the buried doped layer.

9. The device of claim 8, further comprising:
    a shallow trench having a depth shallower than a depth of the middle trench; and
    a deep trench having a depth deeper than the depth of the middle trench,
    wherein the shallow trench is filled with the gap-fill dielectric material, and the deep trench is filled with the interlayer dielectric layer.

10. The device of claim 9, wherein the deep trench is formed to be deeper than the buried doped layer, and an air gap is formed in the deep trench.

11. The device of claim 1, wherein the buried doped layer is a drain region, and
    wherein the semiconductor device is a vertical Double-Diffused Metal-Oxide-Semiconductor (DMOS) device, and an electron movement path is formed in a direction perpendicular to a surface of the substrate.

12. The device of claim 1, wherein the source contact plug includes a plurality of source contact plugs, and the plurality of source contact plugs surround the drain contact plug, and the drain contact plug is located at a center of the plurality of source contact plugs.

13. The device of claim 1, further comprising a Complementary Metal-Oxide-Semiconductor (CMOS) device, an extended drain MOS (EDMOS) device, and a bipolar junction transistor (BJT) device on the substrate.

14. A method of manufacturing a semiconductor device, the method comprising:
    forming a trench gate formed in a substrate;
    forming a source region adjacent the trench gate;
    forming an interlayer dielectric layer on the trench gate and the source region;
    forming a drain contact plug by etching the interlayer dielectric layer and the substrate; and
    forming a source contact plug extended to connect to the source region by etching the interlayer dielectric layer;
    forming a shallow trench in the substrate; and
    forming a deep trench in the substrate,
    wherein a depth of a bottom surface of the drain contact plug is deeper than a bottom surface of the shallow trench and shallower than a bottom surface of the deep trench, and
    wherein the drain contact plug is formed to be deeper than the source contact plug.

15. The method of claim 14, further comprising:
    forming a middle trench in the substrate; and
    forming a gap-fill dielectric material in the middle trench,
    wherein the drain contact plug is formed in the gap-fill dielectric material.

16. The method of claim 15, wherein the forming of the drain contact plug comprises:
    forming a drain contact mask pattern on the interlayer dielectric layer;
    etching the interlayer dielectric layer using the drain contact mask pattern;
    forming a drain contact hole by etching the gap-fill dielectric material in the middle trench; and
    filling the drain contact hole with a conductive material.

17. The method of claim 14, further comprising forming a buried doped layer on the substrate,
    wherein the drain contact plug is formed to extend from the interlayer dielectric layer to the buried doped layer.

18. The method of claim 17, further comprising:
forming a drift region on the buried doped layer;
forming a body region in the drift region;
forming a body contact region in the body region; and
forming a source metal wiring connected to the source contact plug and a drain metal wiring connected to the drain contact plug.

19. The method of claim 18, wherein the drain contact plug extends through the body region and the drift region to the buried doped layer.

20. The method of claim 14, wherein the deep trench is filled with the interlayer dielectric layer, and an air gap is formed in the deep trench.

21. The method of claim 14, further comprising forming a Complementary Metal-Oxide-Semiconductor (CMOS) device, an extended drain MOS (EDMOS) device, and a bipolar junction transistor (BJT) device on the substrate.

22. A semiconductor device comprising:
a buried doped layer formed on a substrate;
a drift region and a trench gate formed on the buried doped layer;
a body region formed in the drift region; and
a drain contact plug formed in the body region, the drift region, and the buried doped layer,
wherein the trench gate includes a plurality of trench gates surrounding the drain contact plug.

23. The device of claim 22, further comprising:
a source region and a body contact region formed in the body region;
an interlayer dielectric layer formed on the trench gate; and
a source contact plug connected to the source region,
wherein a length of the drain contact plug is longer than a length of the source contact plug.

24. The device of claim 23, further comprising:
a source metal wiring formed on the interlayer dielectric layer and connected to the source contact plug; and
a drain metal wiring formed on the interlayer dielectric layer and connected to the drain contact plug.

25. The device of claim 23, wherein the drain contact plug is formed from the interlayer dielectric layer to the buried doped layer.

26. A semiconductor device comprising:
a buried doped layer formed between a substrate and an interlayer dielectric layer;
source contact plugs each formed to extend and connect to a source region;
a drain contact plug formed, deeper than the source contact plugs, between adjacent ones to the source contact plugs to extend and connect to the buried doped layer; and
trench gates each opposingly formed about the drain contact plug,
wherein one of the trench gates is formed between the drain contact plug and one of the source contact plugs and another of the trench gates is formed between the drain contact plug and another of the source contact plugs.

27. The device of claim 26, wherein the source region is formed adjacent the one of the trench gates.

28. The device of claim 27, further comprising:
a drift region formed on the buried doped layer;
a body region formed in the drift region; and
a body contact region formed in the body region,
wherein the drain contact plug is formed to extend to the buried doped layer through the body region and the drift region.

* * * * *